(12) United States Patent    (10) Patent No.:    US 8,452,557 B2
Naumann et al.    (45) Date of Patent:    May 28, 2013

(54) APPARATUS AND METHOD FOR IMPEDANCE MEASUREMENT

(75) Inventors: Lutz Naumann, Haan (DE); Adrian Helwig, Duesseldorf (DE); Wendyam Traore, Sachse, TX (US); Karl-Heinz Steinmetz, Durmersheim (DE); Andreas Fees, Pliezhausen (DE)

(73) Assignees: Texas Instruments Incorporated, Dallas, TX (US); Texas Instruments Deutschland, Freising (DE)

( * ) Notice: Subject to any disclaimer, the term of this patent is extended or adjusted under 35 U.S.C. 154(b) by 333 days.

(21) Appl. No.: 12/910,619

(22) Filed: Oct. 22, 2010

(65) Prior Publication Data

US 2011/0125435 A1    May 26, 2011

(30) Foreign Application Priority Data

Oct. 29, 2009    (DE) .......................... 10 2009 051 233

(51) Int. Cl.
   *G01R 27/00*    (2006.01)
   *G01R 25/00*    (2006.01)

(52) U.S. Cl.
   USPC .............................. 702/65; 324/627; 600/547

(58) Field of Classification Search
   USPC ................... 702/57, 64, 65, 72, 74; 324/601, 324/627, 650; 600/547
   See application file for complete search history.

(56) References Cited

U.S. PATENT DOCUMENTS 3,388,326 A * 6/1968 Brooks .......................... 324/627
5,372,141 A * 12/1994 Gallup et al. .................. 600/547

OTHER PUBLICATIONS

"New Tetrapolar Method for Complex Bioimpedance Measurement: Theoretical analysis and Circuit Realization," Proceedings of the 2005 IEEE, Engineering and Biology 27th Annual Conference, Shanghai, China, Sep. 1-4, 2005, pp. 6605-6607 (Yang, et al.).
"A Microcontroller-Based Scheme for Measurement of L and C," Journal of Measurement Science and Technology, Madras, India, Jan. 1995, pp. 576-581 (Atmanand, et al.).
"A Simple Circuit for Measuring Complex Impedance," Nov. 8, 2008, URL: http:\\www.kennethkuhn.comelectronics/impedance_measurement.pdf, pp. 1-6 (Kenneth Kuhn).
DE Search Report mailed Sep. 6, 2010.

* cited by examiner

*Primary Examiner* — John H Le
(74) *Attorney, Agent, or Firm* — Alan A. R. Cooper; Wade J. Brady, III; Frederick J. Telecky, Jr.

(57) ABSTRACT

A system is provided which includes a signal generator for generating a periodic excitation signal and an analog to digital converter, wherein the system is configured to apply the periodic excitation signal to a network including a known first impedance and a second impedance and to take a first set of M digital samples of a first signal relating to the first impedance and a second set of M digital samples of a second signal relating to the second impedance with a sampling frequency that is an integer multiple of the frequency of the periodic signal. The system is further configured to determine the impedance value of the second impedance by calculating a relative phase difference between the first signal and the second signal using the first set of digital samples and the second set of digital samples.

9 Claims, 7 Drawing Sheets

APPARATUS AND METHOD FOR IMPEDANCE MEASUREMENT

CROSS-REFERENCE TO RELATED APPLICATIONS

This application claims priority from German Patent Application No. 10 2009 051 233.0, filed Oct. 29, 2009, which is hereby incorporated by reference for all purposes.

FIELD OF THE INVENTION

The invention generally relates to an apparatus and a method for impedance measurement.

BACKGROUND

A large variety of known sensors measure physical quantities based on a change of an electrical impedance. The electrical impedance "Z" consists of the real part "R" referred to as resistance and the imaginary part "X" referred to as reactance.

$$Z=R+jX \quad (1)$$

The real part "R" relates to electrical resistors and the imaginary part "X" may relate to capacitance and/or inductance values based on the well known terms $Z_C=1/j\omega C$ or $Z_L=j\omega L$.

In order to determine the value of an unknown impedance, conventional systems use a known reference, as for example, a reference impedance, a reference voltage, a reference current, or time or other reference signals. However, not only the sought physical quantity may change the variable impedance. The precision of a system for impedance measurement can be adversely affected by changing operating conditions (i.e., temperature variations, supply voltage variations, humidity, and so forth). Therefore, known and unknown impedances are configured as a complex voltage divider in order to prevent or reduce negative effects. As the value of the imaginary part of impedance is frequency dependent, a time constant or resonant circuit can be formed for analyzing the frequency as a representation of the change in impedance. In this case, reference components can be included as well. There are various different implementations for this kind of devices. All of them are serving different purposes dedicated to the accuracy, speed and sensor dynamic range. Furthermore, in some cases, a fast reaction to system failure may be needed.

There are many different systems for measuring capacitance or inductance values. Some methods are accurate, some are fast and other low cost. Dependent on the individual requirements, different principles are applied. Capacitance value measurement is used in the industry but not as easy as measuring voltage, current or resistance. This is similar for measuring inductance values. The known principles are all based on generating an AC signal, either for excitation or as time constant or resonance frequency. However, the reaction time of the conventional systems is still too long and the precision too low.

SUMMARY

In one aspect of the invention, an apparatus is provided which comprises a signal generator for generating a periodic excitation signal and at least one analog to digital converter. The apparatus can then be configured to apply the periodic excitation signal to a network which includes a known first impedance (serving as a reference) and a second impedance (the impedance value of which is to be determined). The apparatus may further be configured to take a first set of digital samples of a first signal relating to the first impedance and a second set of digital samples of a second signal relating to the second impedance with a sampling frequency that is an integer multiple of the frequency of the periodic excitation signal. The first signal and the second signal are derived from the periodic excitation signal. The first signal and the second signal may be signals (voltage levels) at different nodes of the network. The first set of samples and the second set of samples are taken without a predetermined absolute phase relationship with respect to the excitation signal. The apparatus may then be configured to determine the impedance value of the second impedance by calculating a relative phase difference between the first signal and the second signal using the first set of digital samples and the second set of digital samples.

According to this aspect of the invention, a frequency locked system is used for determining an unknown impedance value. In order to determine the sought impedance value, sets of digital samples are taken with a fixed oversampling ratio with respect to a frequency of the periodic excitation signal. The calculation of the unknown impedance is then performed using the sets of digital samples. The determination of the unknown impedance is performed without a predetermined fixed absolute phase relationship between the excitation signal and the sampling. The relative phase difference between the first and the second signal can be evaluated. This means that the apparatus can be configured to start sampling of the first and second signal at any time as long as first and second samples are sampled synchronously.

The calculation of the impedance can then be based on a relative phase relationship between the first signal and the second signal. The relative phase relationship may be determined based on the first set of digital samples and the second set of digital samples. According to this aspect of the invention, the relative phase between the signals derived from the impedances can be used for the determination of the unknown impedance. The phase relationship of the first and the second signal with respect to the periodic excitation signal is irrelevant. This aspect of the invention provides an apparatus for determining an unknown impedance, which is configured to operate as a frequency locked system without needing a predetermined absolute phase relationship between the excitation signal and the sampling. An analog-to-digital converter may start sampling at any time and/or any phase with respect to the excitation signal as long as synchronism between sampling and the excitation signal is preserved. This provides that no sampling and hold circuits are required.

The oversampling ratio may be rather small. In some embodiments, an oversampling ratio M between 2 and 8 may be used (M may also be greater than 8, but rather small values are more advantageous). In an embodiment, an oversampling ratio M of 4 may be used. A frequency of the periodic excitation signal may be f0. The sampling frequency for sampling the signals may then be fS. The oversampling ratio M is then given as M=fS/f0.

In an embodiment, a fast Fourier transformation (FFT) may be performed on the sets of digital samples of the first and second signal, in order to determine the amplitude, amplitude ratios and/or the relative phase difference of the signals. In an embodiment using a FFT, more digital samples per period may be used, as for example 32, 64, 128 or 256 or even more in order to increase precision. However, this may adversely affect the time needed in order to update the result.

The first signal y1(t) and the second signal y2(t) may then have the following form:

$$y_1(t) = k_1 * \sin(2\pi f_0 t + \phi_1) \quad (2)$$

$$y_2(t) = k_2 * \sin(2\pi f_0 t + \phi_2) \quad (3)$$

The samples y1(n) of the first signal and the samples y2(n) of the second signal may then be defined as $$y_1(n) = k_1 * \sin\left(\frac{n\pi}{2} + \varphi_1\right) \quad (4)$$

$$y_2(n) = k_2 * \sin\left(\frac{n\pi}{2} + \varphi_2\right) \quad (5)$$

A first set of M samples of the first signal and a second set of M samples of the second signal may then be used for calculating the unknown second impedance value. The number M of samples may then be an integer between 2 and 8. In an embodiment, M may be 4.

The calculation of the unknown impedance may be performed based on trigonometric equations as for example:

$$\tan(\varphi_1 - \varphi_2) = \frac{\sin(\varphi_1 - \varphi_2)}{\cos(\varphi_1 - \varphi_2)} \quad (6)$$

Equation (6) may be developed according to the following equation:

$$\tan(\varphi_1 - \varphi_2) = \quad (7)$$

$$\frac{\sin\left(\frac{n\pi}{2} + \varphi_1\right) * \cos\left(\frac{n\pi}{2} + \varphi_2\right) - \cos\left(\frac{n\pi}{2} + \varphi_1\right) * \sin\left(\frac{n\pi}{2} + \varphi_2\right)}{\cos\left(\frac{n\pi}{2} + \varphi_1\right) * \cos\left(\frac{n\pi}{2} + \varphi_2\right) + \sin\left(\frac{n\pi}{2} + \varphi_1\right) * \sin\left(\frac{n\pi}{2} + \varphi_2\right)} * \frac{k_1 * k_2}{k_1 * k_2}$$

According to an aspect of the invention, the digital samples according to equations (4) and (5) may be used in the trigonometric equations. In an embodiment, the oversampling ratio and therefore the number of samples per period of the periodic excitation signal may be four. If the number of samples is four, equation (7) may be rewritten as $$\tan(\varphi_1 - \varphi_2) = \frac{\begin{bmatrix} y_1(n+0) - \\ y_1(n+2) \end{bmatrix} * \begin{bmatrix} y_2(n+1) - \\ y_2(n+3) \end{bmatrix} - \begin{bmatrix} y_1(n+1) - \\ y_1(n+3) \end{bmatrix} * \begin{bmatrix} y_2(n+0) - \\ y_2(n+2) \end{bmatrix}}{\begin{bmatrix} y_1(n+1) - \\ y_1(n+3) \end{bmatrix} * \begin{bmatrix} y_2(n+1) - \\ y_2(n+3) \end{bmatrix} + \begin{bmatrix} y_1(n+0) - \\ y_1(n+2) \end{bmatrix} * \begin{bmatrix} y_2(n+1) - \\ y_2(n+3) \end{bmatrix}} \quad (8)$$

Equation (8) is valid at any given time. The inverse tangent may then be computed to retrieve the value of the relative phase shift.

According to an aspect of the invention, a constraint may be taken into account. A relative phase shift close to ±90° may be computed. This means that the denominator may become zero. The following condition may be used in order to avoid this:

$$\text{if } \cos(\varphi_1 - \varphi_2) \geq \sin(\varphi_1 - \varphi_2) \quad (9)$$

$$\text{then } \Delta\varphi = \arctan\left[\frac{\sin(\varphi_1 - \varphi_2)}{\cos(\varphi_1 - \varphi_2)}\right]$$

$$\text{else } \Delta\varphi = \text{sign}\left[\frac{\cos(\varphi_1 - \varphi_2)}{\sin(\varphi_1 - \varphi_2)}\right] * \left(\frac{\pi}{2} - \left|\arctan\left[\frac{\cos(\varphi_1 - \varphi_2)}{\sin(\varphi_1 - \varphi_2)}\right]\right|\right)$$

The relative phase Δφ (or phase difference) can then be calculated by using equation (8) in combination with equation (9) in order to avoid invalid conditions.

According to still another aspect of the invention, samples of the first set of samples may be combined in order to remove a DC offset of the first signal. Furthermore, samples of the second set of samples may be combined in order to remove a DC offset of the second signal.

In an embodiment, even samples in a set of samples may be combined. The number of samples n in a set of samples may be equal to the oversampling ratio M. The samples may then be evenly spread over a single period of the periodic excitation signal. In other embodiments, samples of a plurality of periods may be used for determining the relative phase. However, if fewer periods are used, the response time of the system will be reduced.

According to an aspect of the invention, an amplitude of the second signal can be determined based on the second set of samples. Furthermore, an amplitude of the first signal may be determined based on the first set of samples. If the samples are evenly distributed over a period, the calculation of the amplitude and in particular the peak amplitude of either of the signals may be performed in a specific manner. In an embodiment, respective digital samples may be squared and added. The square root of the sum of the squared samples may then be calculated in order to determine the peak amplitude. This is much more efficient than rectifying and low pass filtering which is usually performed. In an embodiment, the amplitudes may be used to determine the unknown second impedance. This may preferably be done if the relative phase difference is close to zero and the phase error exceeds a threshold. The apparatus may then be configured to determine the second impedance based on a ratio of a peak amplitude of the second signal using the second set of samples and a peak amplitude of the first signal using the first set of samples if an error of the relative phase difference exceeds the threshold value. This is advantageous as the determination of the amplitudes generally suffers from gain errors in the circuit. The precision of determining the second impedance based on the relative phase difference between the first and the second signal is more precise. However, if the relative phase difference approaches zero, the error of the relative phase increases and it may then be more precise to use the amplitudes for determining the unknown impedance.

In an aspect of the invention, the apparatus may further be configured to average multiple calculation results, as for example amplitudes, ratios of amplitudes and/or relative phase differences which are determined based on the sets of digital samples. This may be done in order to increase precision. However, as no fixed absolute phase relationship with respect to the excitation signal is required, averaging the calculation results allows for much quicker response times than averaging digital samples.

In an embodiment, the apparatus may be adapted to evaluate the samples of the first set of samples and the second set of samples in order to determine a quadrant of a phase relationship. The samples may then be combined so as to represent a sine of the relative phase (i.e. for example the phase difference) of the phase of the first signal and the phase of the second signal. The samples may also be combined so as to represent a cosine of the relative phase (i.e. for example the phase difference) of the phase of the first signal and the phase of the second signal. The signs of the sine and cosine may then be evaluated in order to determine the quadrant of the relative phase. This is a very efficient way of evaluating relative phase relationships between two signals over the full range of 360°. According to this aspect of the invention, second order impedances, as for example LC circuits may be evaluated.

The invention also provides a method for determining an impedance value. A periodic excitation signal is applied to a network comprising a known first impedance and a second impedance. A first set of M digital samples of a first signal relating to the first impedance is taken. Furthermore, a second set of M digital samples of a second signal relating to the second impedance is taken. The sampling frequency is an integer multiple of the frequency of the excitation signal. The impedance value of the second impedance is then determined by calculating a relative phase difference between the first signal and the second signal using the first set of digital samples and the second set of digital samples. Further method steps can be derived from the description of the other aspects and embodiments of the invention.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION

Figure 1:
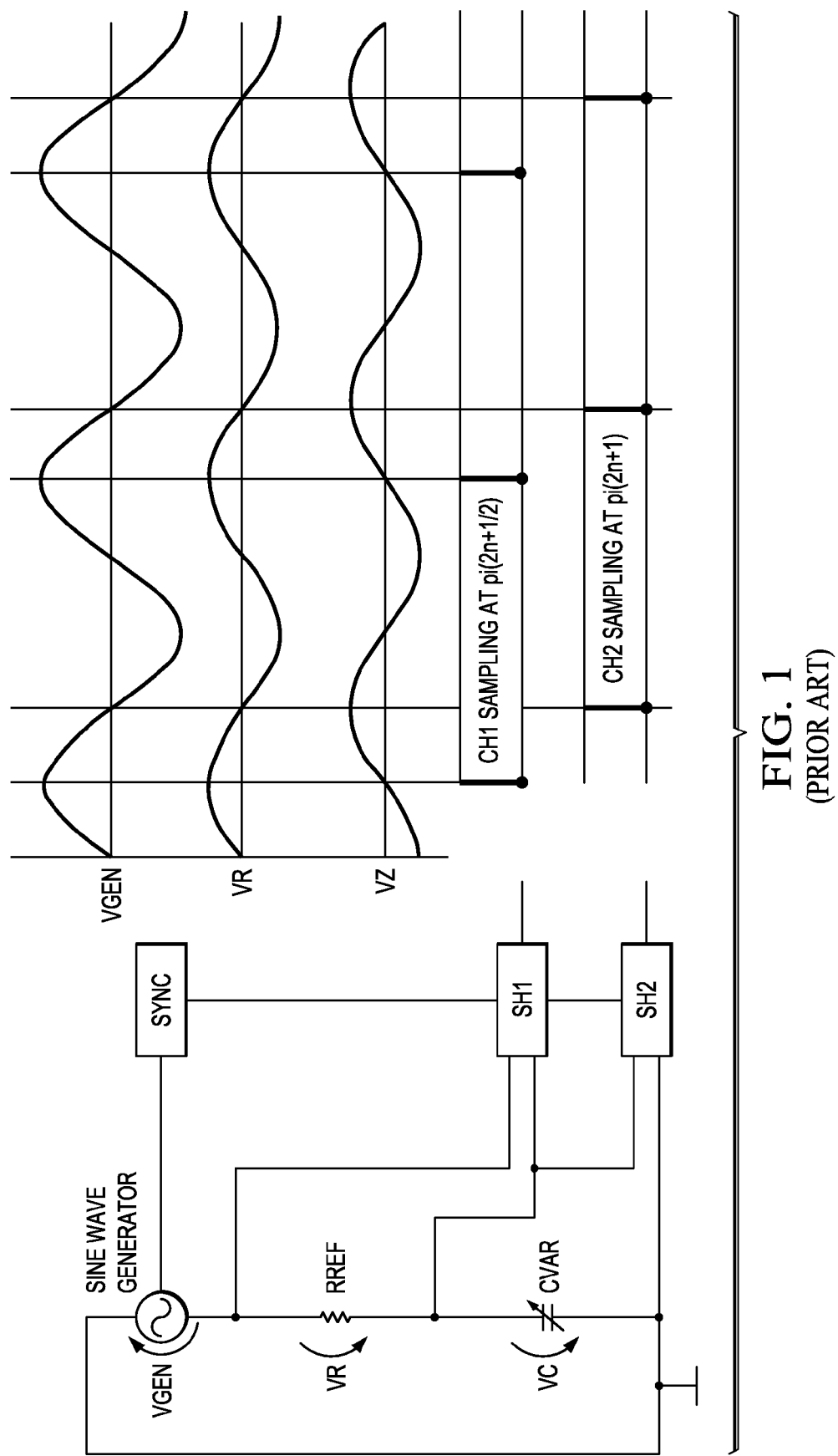
FIG. 1 is a simplified circuit diagram and waveform diagram illustrating conventional impedance measurement.

FIG. 1 shows a simplified circuit diagram and waveforms relating to a prior art circuit for measuring an unknown impedance (which is shown as a variable capacitance CVAR).

The shown circuit uses synchronous demodulation. There is a sine wave generator for excitation and two channels. Each of the channels includes a sample and hold circuit SH1 and SH2, respectively or two data converters like SAR converters which have sample and hold circuits. The sine wave generator and the sample and hold circuits SH1, SH2 are synchronized to the same frequency having a predetermined phase shift. The first circuit SH1 samples always at the peak voltage VR across the reference resistor RREF. Given that a capacitor CVAR is to be measured, the second sample and hold circuit SH2 samples VC with a 90° phase shift (pi/2) with respect to SH1. The output signal of the first channel (with SH1) is the resistive (real) part of a complex pointer representing the ratio of the RC divider. The output of the second channel (with SH2) is the imaginary part of the pointer. As ratios are generally relevant in this case and knowing the excitation frequency and the resistance value of RREF, the capacitance value of CVAR can be calculated. The circuitry can also be adapted for inductive systems. The system requires strict synchronism between the excitation signal and the sample and hold circuits. This means that some high precision analog-to-digital converters, as for example sigma-delta converters can not be used due to the long settling times of their decimation filters.

Figure 2:
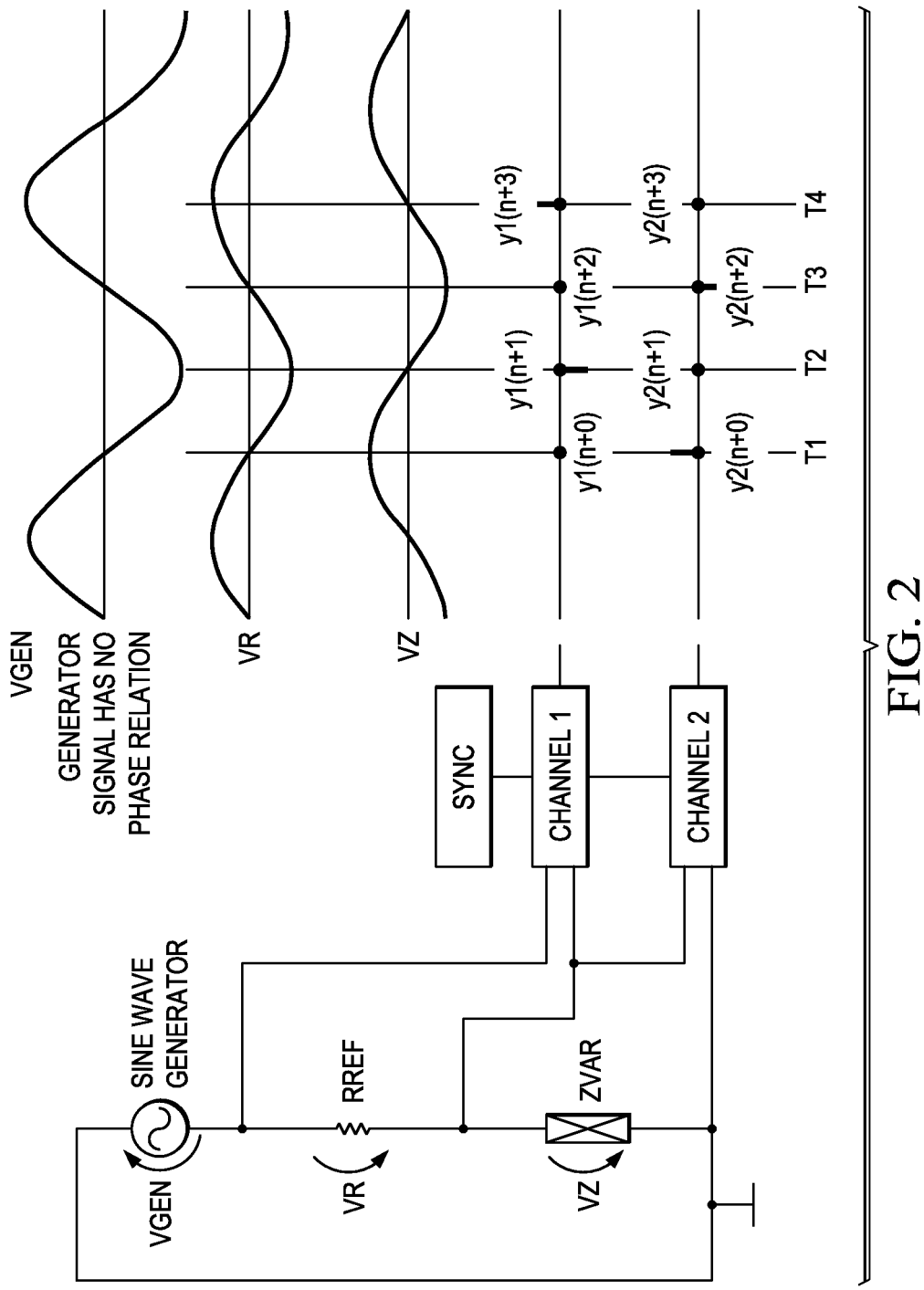
FIG. 2 is a simplified circuit diagram and waveform diagram illustrating aspects of the invention.

FIG. 2 is a simplified circuit diagram and waveform diagram illustrating aspects of the invention. There is a network including a reference resistor RREF which is coupled in series with an unknown impedance ZVAR. The series of resistor RREF and impedance ZVAR is fed with a voltage VGEN provided by a sine wave generator. The voltage drop across RREF is VR and the voltage drop across ZVAR is VZ. The system for determining the unknown impedance ZVAR may then include at least the two channels CH1 and CH2 and a circuit for synchronizing the two channels. Each of the channels CH1 and CH2 may include an input amplifier and an analog-to-digital converter. The two channels may be synchronized with a synchronization circuit SYNC. The input signal VGEN, signals VR and VZ are sinusoidal as described with equations (1) and (2) above. Signals VR and VZ are sampled completely independent of the phase relation to the excitation signal VGEN. This means that a fixed predetermined phase relationship between the excitation signal and any ADCs or sample and hold circuits is not required. This allows sigma-delta converters to be used. In the context of this invention, the oversampling ratio M as previously defined relates to the oversampling of any ADC with respect to the basic frequency of the periodic excitation signal and not to the oversampling of a sigma-delta modulator which is part of a sigma-delta analog-to-digital converter. In this embodiment, the oversampling ratio M may be 4. This means that $f_S=4f_0$, where $f_0$ is the frequency of the sine signal from the sine wave generator and $f_S$ is the sampling frequency of the analog-to-digital converter of each channel CH1, CH2. In the discrete domain, and for example with $$t = \frac{n}{f_S} = \frac{n}{4f_0},$$

the signal can be rewritten as given by equations (4) and (5). Under these conditions, there are four samples for each period of each of the signals VR and VZ as defined by the following equations:

$$y_1(n+0) = k_1 * \sin\left(\frac{n\pi}{2} + \varphi_1\right) \quad y_2(n+0) = k_2 * \sin\left(\frac{n\pi}{2} + \varphi_2\right) \quad (10)$$

$$y_1(n+1) = k_1 * \cos\left(\frac{n\pi}{2} + \varphi_1\right) \quad y_2(n+1) = k_2 * \cos\left(\frac{n\pi}{2} + \varphi_2\right)$$

$$y_1(n+2) = -k_1 * \sin\left(\frac{n\pi}{2} + \varphi_1\right) \quad y_2(n+2) = -k_2 * \sin\left(\frac{n\pi}{2} + \varphi_2\right)$$

$$y_1(n+3) = -k_1 * \cos\left(\frac{n\pi}{2} + \varphi_1\right) \quad y_2(n+3) = -k_2 * \cos\left(\frac{n\pi}{2} + \varphi_2\right)$$

However, if M was greater than 4, a similar set of equations could be given. From the discrete values according to equations (10), it can be established that:

$$y_1(n+0) = -y_1(n+2)$$

$$y_1(n+1) = -y_1(n+3)$$

$$y_2(n+0) = -y_2(n+2)$$

$$y_2(n+1) = -y_2(n+3) \quad (11)$$

According to an aspect of the invention, a DC offset reduction may also be performed. This can be done by combining odd and even samples within a period of the excitation signal. For this embodiment and for M=4, the following equations result:

$$y_1(\sin) = y_1(n=0) - y_1(n+2)$$

$$y_1(\cos) = y_1(n+1) - y_1(n+3)$$

$$y_2(\sin) = y_2(n=0) - y_2(n+2)$$

$$y_2(\cos) = y_2(n+1) - y_2(n+3) \quad (12)$$

With this method, a DC offset for any given period as well as low frequency noise can be cancelled out. This is due to the fact that DC offsets or low frequency disturbances have the same sign for each sample. Subtracting samples which have a phase relationship of 180° (or pi) results in subtraction of the DC offset. The values of the samples are twice the value of a single sample. However, although this may easily be corrected by a division by two (right shift for binary numbers), it is not necessary to perform a division by two as the ratios of the samples of the two signals are generally relevant and both signals are subject to the subtracting step.

According to this aspect of the invention, it is possible to determine the relative phase between the two signals y1 and y2 as well as the peak amplitude of each signal. For computing the relative phase shift between y1 and y2 two successive sample combinations from each signal may be used. This is a robust method that can be easily implemented. Trigonometric equation (6) may then be used and developed to equation (7), which finally leads to equation (8) as previously described. In order to avoid that the denominator of equation (8) becomes zero, the conditions of equations (9) have to be taken into account. It is then possible to always compute a ratio that is less or equal to one and then adjusted according to the condition in which the system operates.

In an embodiment, the amplitude determination can rely on a method that offers a good DC noise cancellation and also filters out high frequency noise. In the present embodiment with M=4, for each of the two signals y1 and y2, four consecutive samples may be combined according to the following formula:

$$\hat{Y} = \frac{1}{2}\sqrt{(y(n+0) - y(n+2))^2 + (y(n+1) - y(n+3))^2}, \quad (13)$$

where $\hat{Y}$ is the amplitude and y(i) is a digital sample of either one of the signals y1 or y2. This way of determining the amplitude offers some advantages with respect to rectification and low pass filtering methods which use the RMS value of the sine wave. Those methods generate a delay due to the low pass filtering time constant and cannot react immediately to changes in the sine amplitude. However, according to this aspect of the invention, the minimum delay can be reduced to one period of the excitation signal and even a sudden change of the amplitude $\hat{Y}$ (the change may be expressed as $d\hat{Y}/dt$) can be detected immediately. This allows detection of individual amplitude changes of y1 and y2 and detection of changes of the amplitude ratio.

Either the relative phase (phase difference between y1 and y2) or the relationship of the peak amplitudes of y1 and y2 can be used for recalculating any unknown impedances. So the present invention allows capacitive, inductive and resistive impedances to be measured.

Figure 3:
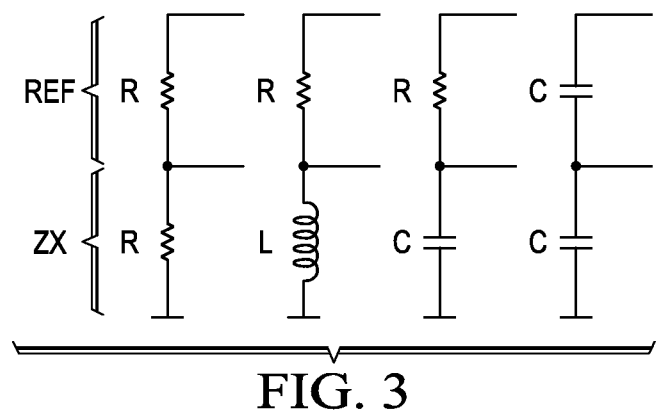
FIG. 3 is a simplified circuit diagram of possible impedance networks to be used for embodiments of the invention.

FIG. 3 shows examples of different configurations of networks to which the present invention may be applied. The network may be a series of two resistors R, one of which is the reference REF and the other the unknown impedance ZX. Other configurations may be a series of a resistor R as reference REF and an inductor L or a capacitor C as unknown impedance, as well as two capacitors C in series one of which is unknown. The system and the method according to aspects of the invention may then be configured to sense a voltage across the unknown impedance ZX. The phase shift caused by the impedance may then be processed. However, in case of no phase shift as for example for purely resistive (R, R) or capacitive (C, C) dividers, the amplitudes, or the ratio of amplitudes may be used for determining the unknown component. In an embodiment, amplitude and relative phase determination may be combined in order to achieve maximum flexibility. Even though using the relative phase may provide higher accuracy, it might be useful to combine both methods. In an embodiment, a specific configuration (impedances of a network to be measured) may approach a relative phase difference of zero and a corresponding error may rise, the impedance determination in the system may be switched from using the relative phase to using amplitude calculation.

Figure 4:
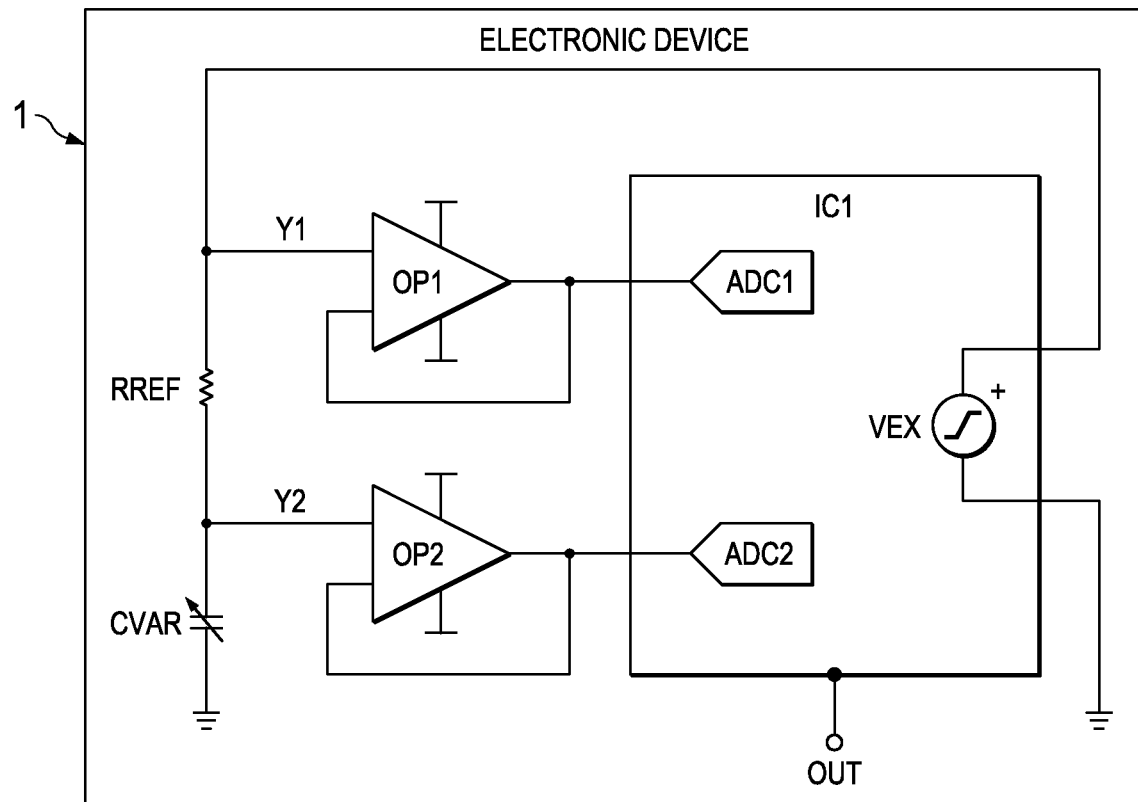
FIG. 4 is a simplified circuit and block diagram of an embodiment of the invention.

FIG. 4 shows a very simplified circuit and block diagram of an embodiment of the invention. In this embodiment, the unknown impedance is a variable capacitance CVAR and the reference impedance is a resistor RREF. RREF and CVAR are coupled in series. The system 1 may comprise a first operational amplifier OP1 which is coupled to buffer and/or amplify the voltage at one side of the reference resistor. The system 1 also comprises a second operational amplifier OP2 which is coupled to buffer and/or amplify the signal between the variable capacitor CVAR and the resistor. In an embodiment, the operational amplifiers OP1, OP2 may be configured as buffers having an amplification factor of 1. The other side of the variable capacitor is coupled to ground. The output signals of OP1 and OP2 are fed as signals AD1 and ADC2 to respective analog-to-digital converters. These analog-to-digital converters may be integrated in a separate integrated circuit IC1. However, the components shown in FIG. 4 may also be integrated in a single integrated circuit. The excitation signal VEX may be a periodic signal as for example a sine signal. The frequency of the signal may then be $f_0$. The sampling frequency $f_S$ of the analog to digital converters may be a factor M greater than the frequency $f_0$ of the periodic excitation signal VEX. The excitation signal VEX may be generated in the integrated circuit IC1 and fed to the network of impedances, which is the series of RREF and CVAR in this embodiment. The system 1 provides an output signal OUT which may indicate the unknown impedance (CVAR in this embodiment). The calculation steps are performed in the integrated circuit IC1 according to the equations and formulas (8) to (13) and the respective explanations given above.

Figure 5:
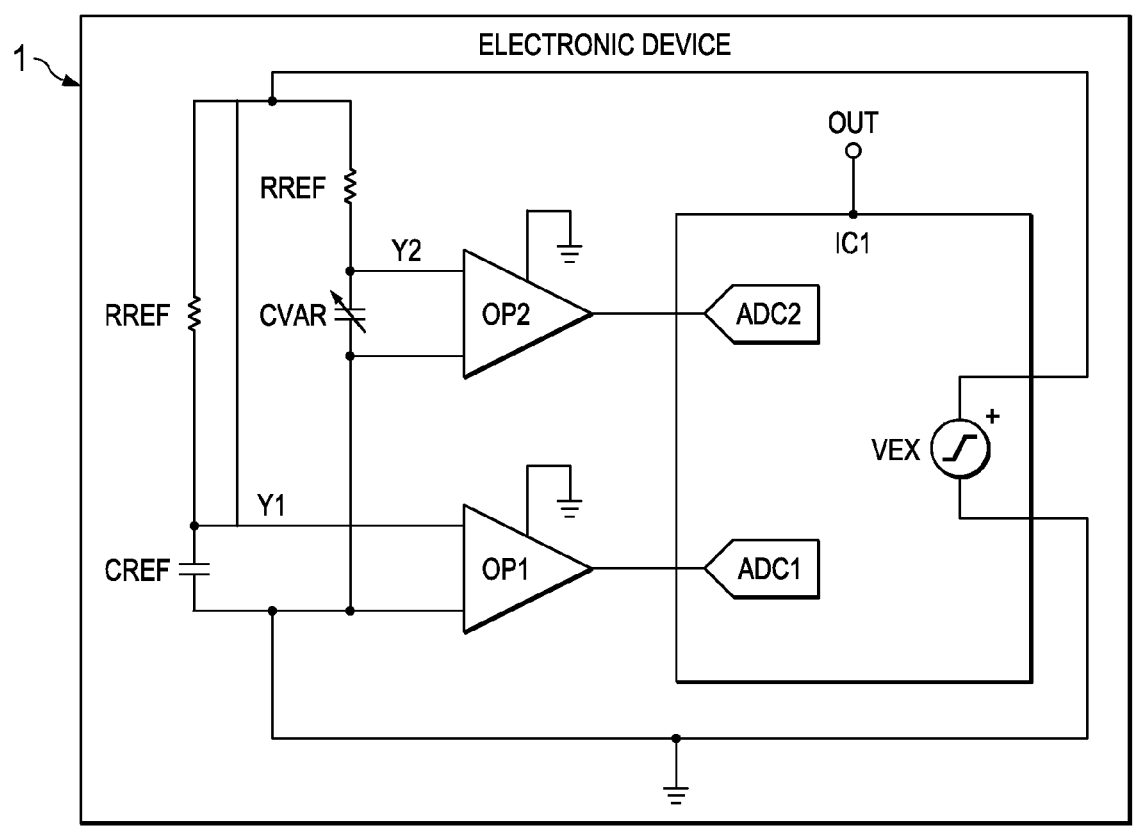
FIG. 5 is a simplified circuit and block diagram of an embodiment of the invention.

FIG. 5 shows another embodiment of the invention, which is substantially similar to the embodiment shown in FIG. 4. However, the impedance network is more complex. The network includes two paths each having a series of a reference resistor RREF and a capacitance CREF or CVAR, respectively. The capacitance CREF is also known and CVAR is the capacitance, which is to be determined. The input amplifiers OP2 and OP1 are coupled to the node between RREF and CREF and RREF and CVAR, respectively. The two reference resistors RREF are coupled at one side to receive the excitation signal VEX. The output signals of the operational amplifiers are fed to two channels of the integrated circuit for being analog-to-digital converted and further processed in accordance with the above equations and formulas (8) to (13). The result, which indicates the unknown impedance, is provided by the output signal OUT.

For this embodiment, the unknown impedance CVAR may then be calculated as follows. The first method is based on the amplitude ratio:

$$C_{var} = \frac{\sqrt{\left(\frac{\hat{Y}1}{\hat{Y}2}\right)^2 (A^2+1) - 1}}{B} \quad (14)$$

with $A = 2\pi f R_{ref} C_{ref}$ $B = 2\pi f R_{ref}$

The amplitudes $\hat{Y}1$, $\hat{Y}2$ are determined according to equation (13). A and B can be pre-calculated relaxing the requirements of the computation performance, and the amplitude ratio may be retrieved from a register or look-up-table. The accuracy will be affected by gain errors and gain drift of the input circuitry OP1, OP2. Assuming a good matching and buffers with a gain of 1 used as impedance buffers OP1, OP2 a very accurate result can be achieved. Based on the phase difference or the relative phase between Y1 and Y2, the following calculation is to be performed:

$$C_{var} = \frac{\tan(\Delta\varphi + A)}{B} \quad (15)$$

with $A = \arctan(2\pi f R_{ref} C_{ref})$ $B = 2\pi f R_{ref}$

The relative phase $\Delta\varphi$ (or phase difference) is determined in accordance with equations (8) and (9). As for the amplitude calculation, A and B may be pre-calculated and the phase difference may be retrieved from a register or a look-up-table. The accuracy is neither affected by gain difference or gain drift nor by offset and offset drift and provides the highest accuracy. This is an example for a specific input network.

However, the skilled artisan can easily perform the modifications and apply the invention to various different input configuration and purposes. The recalculation of the unknown impedance may either be done inside the front end using its computation capability or it can be done in an external processor, which may then form part of the system.

In more general terms, the unknown impedance is a function of either the relative phase difference of the two signals or of the amplitude ratio of the two signals. This can be expressed as:

$ZVAR = f(\Delta\varphi)$ or (16)

$ZVAR = f(\hat{Y}1, \hat{Y}2)$ (17)

Figure 6:
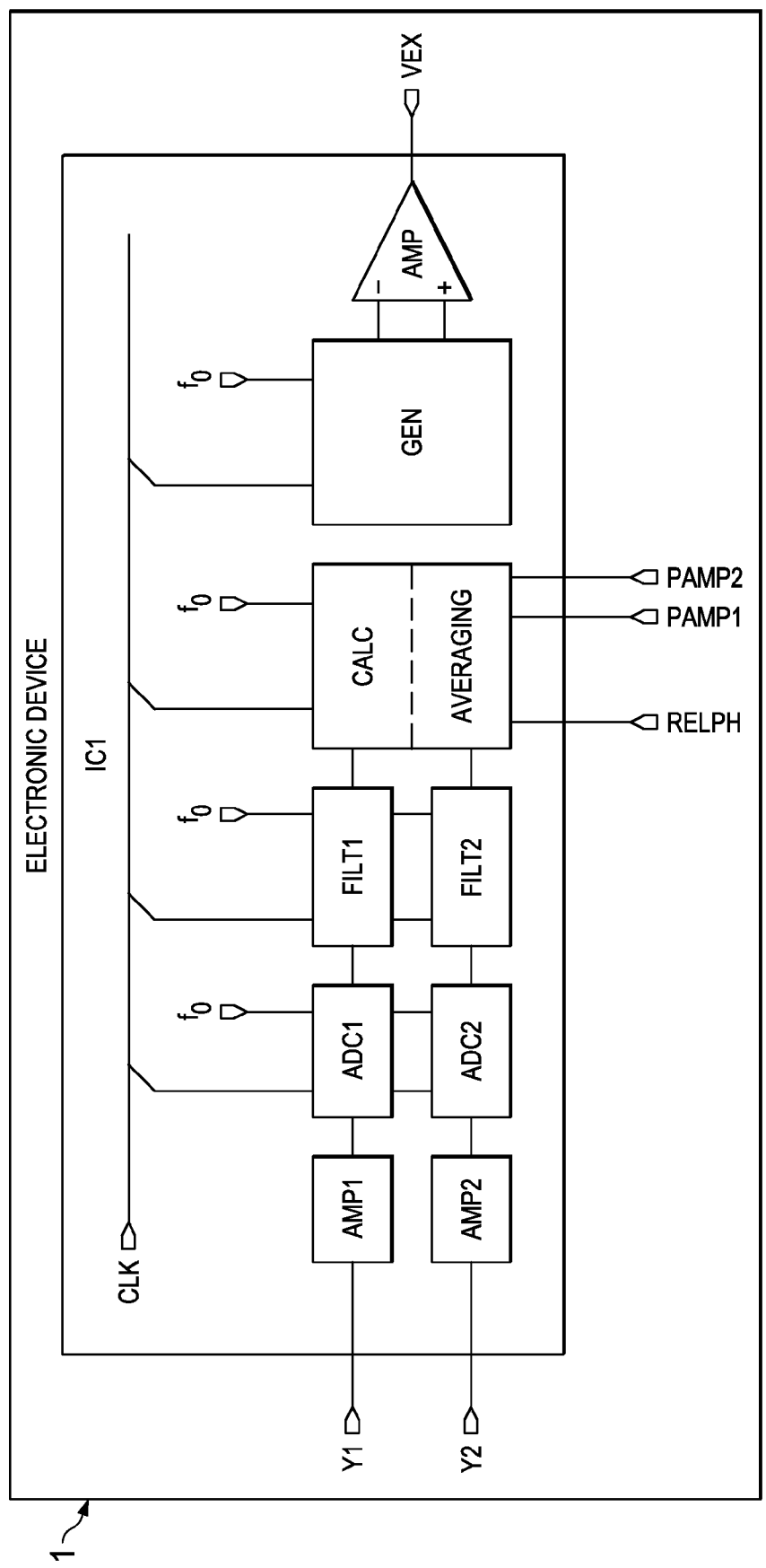
FIG. 6 is a simplified circuit and block diagram of an embodiment of the invention.

FIG. 6 shows a simplified circuit and block diagram of an embodiment of the invention. The system 1 may basically comprise an integrated circuit IC1. The integrated circuit IC1 may be an embodiment of the integrated circuit IC1 shown in FIG. 4 and FIG. 5. The integrated circuit IC1 may include two channels for each of the signal Y1 and Y2. Each of the two channels may include an amplifier AMP1 and AMP2, an analog-to-digital converter and a digital filter FILT1, FILT2, respectively. Either of the two input signals Y1 and Y2 is buffered and/or amplified, analog-to-digital converted and filtered. The gain of the input amplifiers AMP1 and AMP2 may be programmable. However, in an embodiment of the invention, the amplifiers may have a gain of one but they may be configured to have little tolerance with respect to their gain values (good matching). The sampling frequency of the analog-to-digital converters may be four times the frequency of the periodic excitation signal VEX. The analog-to-digital converters ADC1, ADC2 may therefore be configured to sample every 90° (pi/2) of the sine wave of the excitation signal. This means that the sine wave can already be calculated from two adjacent samples. The system clock CLK is fed to the analog-to-digital converters ADC1, ADC2, the digital filters FILT1, FILT2, the calculation circuit CALC and to all other digital circuits as well as the signal generator GEN. This provides synchronous operation of all circuits.

In an embodiment, ADC1 and ADC2 may be 24 Bit sigma-delta analog-to-digital converters with a data rate up to 96 kHz. They may be configured to use four times oversampling referred to the generator frequency $f_0$. Sigma-delta converters provide some advantages with respect to other converters, as for example successive approximation register (SAR) converters, as for example high robustness with respectively low noise and low power. Due to the specific way of determining the unknown impedance in accordance with invention, the analog-to-digital converters ADC1, ADC2 do not need to be in a specific phase relation with the generator signal VEX. The analog-to-digital converters ADC1, ADC2 generally maintain the same phase relationship with respect to each other once they started operation.

The filters FILT1 and FILT2 may be digital bandpass filters with a center frequency $f_0$, which is the frequency of the excitation signal. The quality factor Q of the filters FILT1 and FILT2 may be extremely high, as for example Q=200. The filters FILT1 and FILT2 may be configured to have adjustable quality factors Q. A higher Q value may increase the response time, but it may also improve signal quality. An adjustable Q value may therefore be useful to find an optimum Q value for different applications. The filters FILT1 and FILT2 are useful to remove offset and harmonics of the input signals Y1 and Y2. However, it was found that even with a high Q and a long settling time this settling time generally matters until the filter is settled. For a continuously running application, the input signal change will be influenced by the step response behavior of the band pass filter and so signal changes can be detected extremely fast even with a high Q. The center frequency of the filters FILT1 and FILT2 can be set to the generator frequency $f_0$. The digital implementation of the filters FILT1, FILT2 allows exact adjustment to the excitation signal. It is advantageous that the Q of a digital filter can be much higher than for an analog implementation. Furthermore, due to the digital implementation the band pass filters of both channels can achieve a perfect match and do not generate any offset, gain or phase match error which is very advantageous for the performance of the implementation.

The calculation circuit CALC is configured to receive the digital and filtered signals Y1 and Y2 and to perform the calculation steps on these signals given by equations and formulas (8) to (13). However, the calculation steps may easily be adapted to other oversampling ratios than 4. The oversampling ratio M may generally be $M=f_S/f_0$. The calculation circuit CALC receives the frequency $f_0$ of the excitation signal VEX. Also the filters FILT1, FILT2 and the analog-to-digital converters ADC1, ADC2 receive the frequency $f_0$. The analog-to-digital converters ADC1, ADC2 may then be configured to have a sampling frequency $f_S$ in order to achieve the oversampling M. In this embodiment M may be 4. The calculation circuit may then be configured to determine the relative phase (i.e. the phase difference) of Y1 and Y2 based on the digital samples and in accordance with the above explanations and formulas (in particular equations (9) to (12)). The calculation circuit may also be configured to determine the peak amplitudes of signals Y1 and Y2 based on their digital samples and in accordance with the above formulas (in particular equation (13)). The calculation circuit may also include an averaging circuit which may be configured to perform programmable averaging. Averaging may be performed on the digital samples and/or intermediate results or the final results of the impedance determination process. However, averaging the digital samples means that these samples are to be averaged over multiple periods of the signals. Therefore, in an embodiment, the amplitude values or amplitude ratios and/or the relative phase values may be averaged rather than the digital samples. This provides a shorter response time as, according to an aspect of the invention, no fixed phase relationship between the excitation signal and the points of time, when either of the first or second signal is sampled is required.

Since averaging may increase the response time, the amount of averaging may be flexibly adjusted with respect to different applications. The signal generation circuit GEN basically generates the periodic excitation signal with a frequency $f_0$ and feeds the signal to an amplifier AMP from which the signal can be supplied to the network including the unknown impedance. In an embodiment, the signal generator GEN may be programmable so as to provide an output frequency between 0 Hz to 24 kHz. Due to the flexible frequency this embodiment may be adapted to a wide range of capacitive or inductive networks (for example inductive or capacitive sensors). The calculation circuit CALC provides signals indicating the sought impedance. These signals may include the relative phase RELPH between Y1 and Y2, and/or the peak amplitudes PAMP1, PAMP2 of signals Y1 and Y2. Several options of data outputs are conceivable. In one embodiment, the raw data output of the relative phase difference signal as well as the amplitudes for left and right channels may be provided. The provided raw data may be further processed in accordance with individual input circuitry and linearization requirements. Optional processing can be done as well such as calculating the ratio of the amplitudes, averaging the measured values for further noise reduction and higher accuracy, implementation of comparator features indicating alert conditions which may be made available as software flags, interrupts or on hardware pins.

The aspects and embodiments of the invention can also be applied to 2nd order systems that cover the full 360 degree range. Such systems are for instance LC systems. If the generator frequency is swept through, the invention may even be applied to complex impedance measurement. Generally, in this embodiment of the invention, $\sin(\phi_1-\phi_2)$ and $\cos(\phi_1-\phi_2)$ may be determined and the signs may be used in order to determine the quadrant relation of the relative phase shift of signals Y1 and Y2. A1 and A2 are the values of sine and cosine of the phase difference according to the following equations:

$$A_1 = \sin(\phi_1-\phi_2) \tag{18}$$

$$A_2 = \cos(\phi_1-\phi_2) \tag{19}$$

The quadrant can then be found according to the following conditions:

$$[A_1(+)] \text{ and } [A_2(+)] \rightarrow Q_1 \text{ positive ratio}$$

$$[A_1(+)] \text{ and } [A_2(-)] \rightarrow Q_2 \text{ negative ratio}$$

$$[A_1(-)] \text{ and } [A_2(-)] \rightarrow Q_3 \text{ positive ratio}$$

$$[A_1(-)] \text{ and } [A_2(+)] \rightarrow Q_4 \text{ negative ratio} \tag{20}$$

The phase shift may then be calculated depended on the quadrant difference by analyzing the ratio of A1/A2. The appropriate equation for each case can be found as follows:

$$\text{if } \left(\frac{A_1}{A_2} \leq 1\right) \tag{21}$$

$$Q_1 \rightarrow (\varphi_1 - \varphi_2) = \arctan\left(\frac{A_1}{A_2}\right)$$

$$Q_2 \rightarrow (\varphi_1 - \varphi_2) = \pi + \arctan\left(\frac{A_1}{A_2}\right)$$

$$Q_3 \rightarrow (\varphi_1 - \varphi_2) = -\pi + \arctan\left(\frac{A_1}{A_2}\right)$$

$$Q_4 \rightarrow (\varphi_1 - \varphi_2) = \arctan\left(\frac{A_1}{A_2}\right)$$

$$\text{if } \left(\frac{A_1}{A_2} > 1\right) \tag{22}$$

$$Q_1 \rightarrow (\varphi_1 - \varphi_2) = \frac{\pi}{2} - \arctan\left(\frac{A_2}{A_1}\right)$$

$$Q_2 \rightarrow (\varphi_1 - \varphi_2) = \frac{\pi}{2} - \arctan\left(\frac{A_2}{A_1}\right)$$

$$Q_3 \rightarrow (\varphi_1 - \varphi_2) = -\frac{\pi}{2} - \arctan\left(\frac{A_2}{A_1}\right)$$

$$Q_4 \rightarrow (\varphi_1 - \varphi_2) = -\frac{\pi}{2} - \arctan\left(\frac{A_2}{A_1}\right)$$

In an embodiment which is configured to be used for second order impedances, all the above cases are implemented. However, it is then possible to analyze the whole 360° (or 2 pi) range. Furthermore, the system according to the invention may be configured to sweep the excitation frequency. This provides the possibility of measuring the complete complex impedance. The amplitude method can remain unchanged.

According to another aspect of the invention, a linearization step is introduced. Real sensors do not have a linear behavior between the physical measured quantity x and their output in most cases. This is referred to as a nonlinear transfer function. According to this aspect, a nonlinear correction may be used to achieve the wanted linear behavior. This can be solved by the approximation of the inverse nonlinear transfer function and multiplication with the sensor output as expressed with the following equation:

$$G_{linear}(x) = G_{nonlinear\_Sensor}(x) \cdot G_{nonlinear\_Correction}(x) = x \quad (23)$$

with $$G_{nonlinear\_Correction} = \frac{1}{G_{nonlinear\_Sensor}},$$

where x is a parameter or physical quantity (for example pressure, capacitance value or inductivity) which changes. The impedance value ZVAR which is to be determined is then a function of physical quantity x. This function depends on the transfer characteristic of a specific sensor and the subsequent processing and calculation steps. The impedance value ZVAR may then be a variable impedance of any kind of sensor and $G_{linear}(x)$ is the linear function of x after correction. The nonlinear behavior of the sensor front end in response to the parameter x is $G_{nonlinear\_Sensor}(x)$. The inverse function of $G_{nonlinear\_Sensor}(X)$ is $G_{nonlinear\_Correction}(X)$ which is used for linearization. The linearization may be performed in circuit CALC shown in FIG. 6. A polynomial approximation may be implemented. Alternatively the linear correction may be performed in an external processor by different methods like look up tables or polynomial approximation or other methods.

Figure 7:
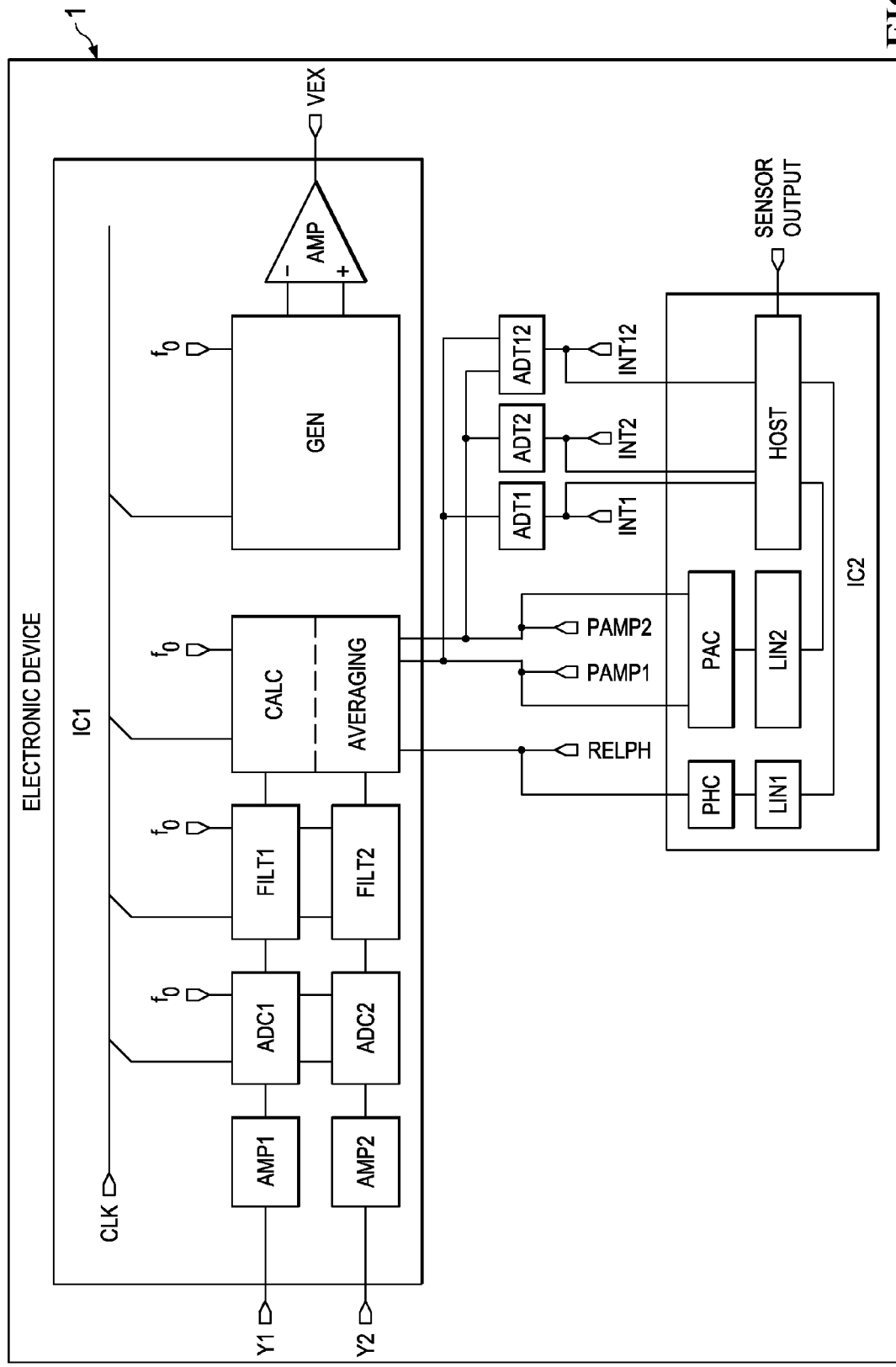
FIG. 7 is a simplified circuit and block diagram of an embodiment of the invention.

FIG. 7 shows a simplified circuit and block diagram of an embodiment of the invention. The system 1 is basically similar to the embodiment shown in FIG. 6. In addition to the embodiment of FIG. 6, this embodiment is configured to perform detection of sudden amplitude changes. Furthermore, linearization of the output signals is performed. There are circuits ADT1, ADT2, and ADT12 which are configured to detect sudden amplitude changes of signals Y1, Y2 and relative amplitude changes of the two signals Y1, Y2, respectively. Respective interrupts INT1, INT2 and INT12 are issued, if a change of an amplitude or a change of the ratio of the amplitudes occurs and/or exceeds a predetermined threshold value. The relative phase value (Δφ) is passed as raw data to a calculation circuit PHC for determining the impedance based on the relative phase as previously explained. Furthermore, the peak amplitude values PAMP1 and PAMP2 of the input signals Y1 and Y2 are passed to an amplitude calculation circuit PAC. Amplitude calculation circuit PAC calculates the unknown impedance value based on the peak amplitude data $\hat{Y}1, \hat{Y}2$ as explained for a specific embodiment with respect to FIG. 5. Linearization circuits LIN1 and LIN2 are also provided and configured to perform linearization of nonlinear behavior of the determined impedance values (either based on the amplitudes or based on the relative phase). The linearization is performed as previously described with respect to equation (23). This embodiment uses two separate integrated circuits IC1 and IC2. This may be useful in order to provide greater flexibility in configuring and adjusting the second IC2. In particular, it might be useful to allow end-customers to use their own data in IC2, whereas IC1 can be pre-configured.

Figure 8:
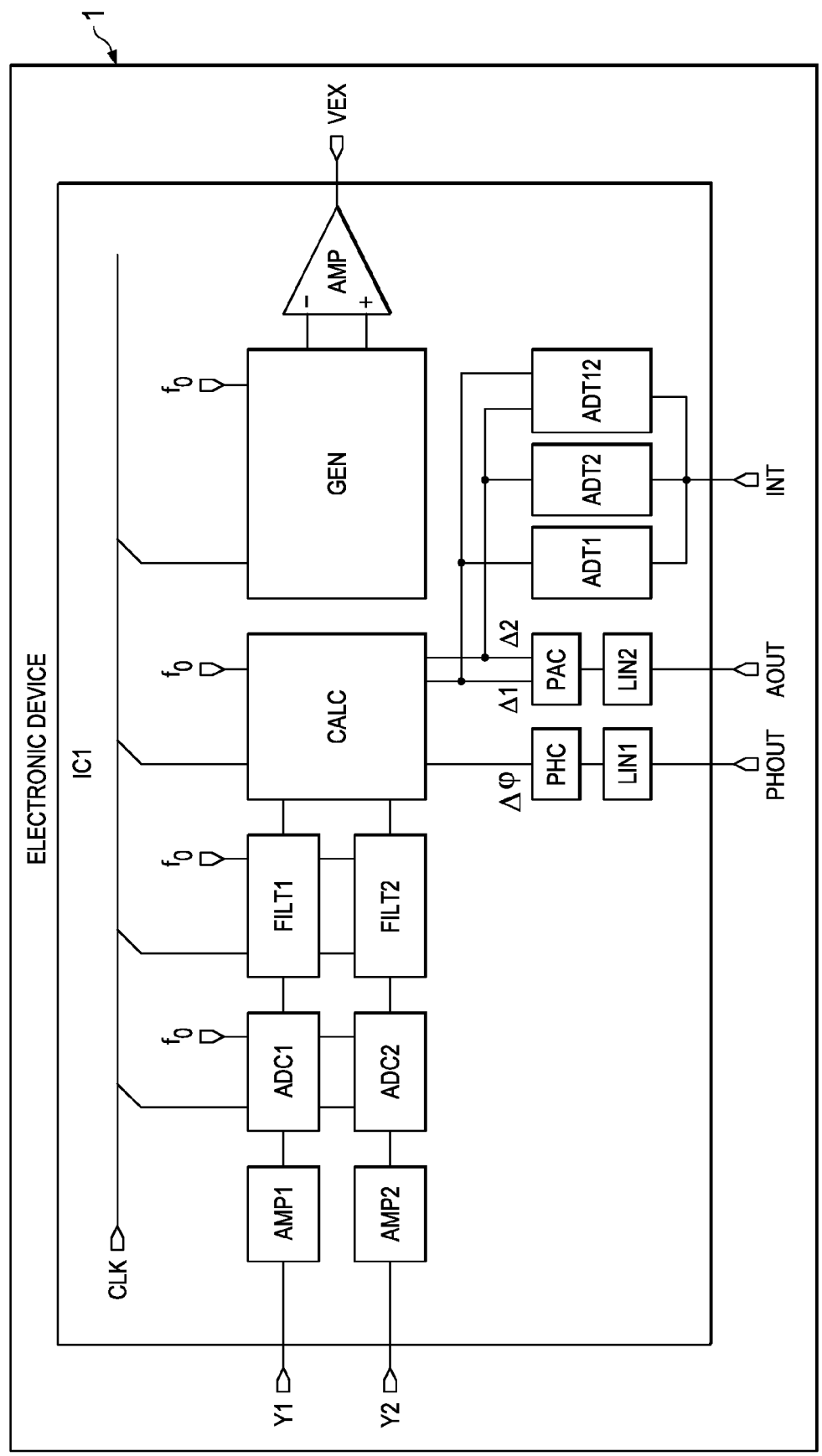
FIG. 8 is a simplified circuit and block diagram of an embodiment of the invention.

FIG. 8 shows a simplified circuit and block diagram of an embodiment of the invention. The system 1 is basically similar to the embodiment shown in FIG. 7. However, in this embodiment, a higher level of integration is achieved. The amplitude change detection circuits ADT1, ADT2 and ADT12 as well as circuits PHC, PAC and LIN1, LIN2 are also integrated on the same integrated circuit IC1. The impedance values are directly provided as an amplitude value AOUT and a phase value PHOUT. Raw data relating to the relative phase (Δφ), and peak amplitudes ($\hat{Y}1, \hat{Y}2$) are internally processed. If a sudden change of an amplitude or an amplitude ratio occurs an interrupt is issued as signal INT.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a signal generator that generates an excitation signal;
   an impedance network that is coupled to the signal generator so as to receive the excitation signal, wherein the impedance network includes a first impedance and a second impedance, and wherein the first impedance is a reference impedance; and
   an impedance meter that is coupled to the impedance network, wherein a sampling network generates a first set of digital samples that corresponds to a first signal from the first impedance and generates a second set of digital samples that corresponds to a second signal from the second impedance, and wherein the impedance meter determined a magnitude of the second impedance by calculating a relative phase difference between the first and second signals using the first and second sets of digital samples.

2. The apparatus of claim 1, wherein the impedance meter includes a first channel and a second channel.

3. The apparatus of claim 2, wherein each of the first and second channels further comprise:
   an amplifier that is coupled to the impedance network; and
   an analog-to-digital converter (ADC) that is coupled to the amplifier.

4. The apparatus of claim 3, wherein each of the first and second channels further comprises a filter that is coupled to the ADC.

5. The apparatus of claim 4, wherein the impedance meter further comprises a calculation circuit that is coupled to each of the filters.

6. An apparatus comprising:
   a signal generator that is configured to provide an excitation signal to a reference impedance and a sensed impedance of an impedance network;
   a first channel having:
   a first amplifier that is configured to be coupled to the impedance network so as to receive a first signal from the reference impedance; and
   a first ADC that is coupled to the first amplifier so as to generate a first digital signal; a second channel having:
   a second amplifier that is configured to be coupled to the impedance network so as to receive a second signal from the sensed impedance; and
   a second ADC that is coupled to the second amplifier so as to generate a second digital signal; and
   calculation circuit that is coupled to the first and second ADCs so as to determine a magnitude of the sensed impedance by calculating a relative phase difference between the first and second signals from the first and second digital signals.

7. The apparatus of claim 6, wherein the first and second ADCs are sigma-delta converters.

8. The apparatus of claim 7, wherein the first and second channels each respectively comprise:
- a first filter that is coupled between the first ADC and the calculation circuit; and
- a second filter that is coupled between the second ADC and the calculation circuit.

9. The apparatus of claim 8, wherein the first ADC, the second ADC, the calculation circuit, and the signal generator each receive a clock signal.

* * * * *